United States Patent [19]

Maemoto

[11] Patent Number: 4,946,761
[45] Date of Patent: Aug. 7, 1990

[54] IMAGE-FORMING LAYER

[75] Inventor: Kazuo Maemoto, Shizuoka, Japan

[73] Assignee: Fuji Photo Film Co., Ltd., Minami-Ashigara, Japan

[21] Appl. No.: 224,376

[22] Filed: Jul. 26, 1988

[30] Foreign Application Priority Data

Jul. 28, 1987 [JP] Japan ................. 62-188453

[51] Int. Cl.$^5$ .......................... G03F 7/00; G03F 7/028
[52] U.S. Cl. ...................................... 430/270; 430/285; 430/326; 430/617; 430/910; 522/152
[58] Field of Search ............... 430/270, 285, 326, 910, 430/617; 522/152

[56] References Cited

U.S. PATENT DOCUMENTS

| | | | |
|---|---|---|---|
| 4,327,170 | 4/1982 | Sander et al. | 430/285 |
| 4,363,871 | 12/1982 | Shibue et al. | 430/523 |
| 4,622,289 | 11/1986 | Harai et al. | 430/617 |
| 4,626,500 | 12/1986 | Sato et al. | 436/617 |
| 4,659,653 | 4/1987 | Sato et al. | 430/617 |
| 4,693,958 | 9/1987 | Schwarth et al. | 430/326 |

OTHER PUBLICATIONS

Journal of Chemical Society (1971), R.S. Devidson and P. R. Steiner; Department of Chemistry, The University Leicester.
Journal of Photochemistry, 33 (1986), 237–255.

Primary Examiner—Paul R. Michl
Assistant Examiner—Thorl Chea
Attorney, Agent, or Firm—Burns, Doane, Swecker & Mathis

[57] ABSTRACT

The present invention relates to an image-forming layer which comprises a polymer having a carboxyl group-containing group which can be decarboxylated by exposure. According to the present invention, an image-forming layer having an improved coating strength and adhesion to a support, can be obtained.

6 Claims, No Drawings

IMAGE-FORMING LAYER

FIELD OF THE INVENTION

The present invention relates to a new image-forming layer. In particular, the present invention relates to an image-forming layer which is capable of forming a negative image for an original by decarboxylating a carboxylic acid in a polymer constituting the layer to change the solubility of the polymer in an alkali developer.

BACKGROUND OF THE INVENTION

Recently, an alkali development method which uses an aqueous alkali developer have been employed in place of a conventional development method in which a developer which mainly comprising an organic solvent is used in a step of forming printing plates or resists due to concerns associated with safety and sanitation. Therefore, a photosensitive layer suitable for the alkali development is necessitated and various polymers or resins containing a carboxyl group are used as binders. However, an image area remaining after the exposure and development is swollen with the alkaline developer due to the carboxylic acid contained therein. Therefore, when such materials are used for the printing plate or resist, the coating strength and the adhesion of the layer to a support are insufficient. This is an essential problem of the alkali development.

SUMMARY OF THE INVENTION

The object of the present invention is, therefore, to provide an image-forming layer having improved coating strength and adhesion to the support.

After intensive investigations made for the purpose of attaining the above-mentioned object, the inventors have found out that the object can be attained by introducing, into a binder polymer, a carboxylic acid or an analogue thereto as described in Journal of Photochemistry, Vol. 33 (No. 2), pages 237 to 255 (1986) and Journal of the Chemical Society, Section C, pages 1682 to 1689 (1972), as a carboxylic acid capable of being decarboxylated by exposure. The present invention has been completed on the basis of this finding.

The present invention relates to an image-forming layer comprising a polymer having a group containing a carboxyl group which can be decarboxylated by exposure in the presence or absence of a sensitizer.

DETAILED DESCRIPTION OF THE INVENTION

Now, the detailed description will be made on the present invention.

Preferred examples of the polymers having a group containing a carboxyl group which can be decarboxylated by exposure in the presence or absence of a sensitizer, which polymers are usable for forming the image-forming layer in the present invention (hereinafter referred to as "the present polymer"), include those in which the group containing a carboxyl group (hereinafter referred to as "carboxyl group-containing group") is represented by the formula:

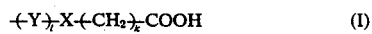  (I)

which carboxyl group-containing group is connected with the main chain of the polymer (P) directly or through a connecting group (Z).

In the above formula (I), Y represents a substituted or unsubstituted alkylene, arylene, aralkylene or divalent heterocyclic ring, k represents 0 or 1 and l represents 0 or 1. X represents a sulfur atom, an oxygen atom, a single bond, C=W or N—U (W represents an oxygen atom or a sulfur atom and U represents a substituted or unsubstituted aryl or alkyl group or a hydrogen atom). When k=l=0, X is C=W. Among X's, the sulfur atom, C=W or N—U is preferred from the viewpoint of the sensitivity.

From the viewpoint of the sensitivity, it is preferred that the group -X—CH₂COOH is bonded with the aryl nucleus or aromatic heterocyclic nucleus when X is a sulfur atom, an oxygen atom, a single bond or N—U. This aryl nucleus or heterocyclic nucleus may be in either a side chain or the main chain of the polymer.

Preferred examples of the carboxyl group-containing groups include residues having a skeleton of the following compounds: indole-3-acetic acid, phenoxyacetic acid, 2-methylphenoxyacetic acid, 3-methoxyphenoxyacetic acid., 2nitrophenoxyacetic acid, 3-chlorophenoxyacetic acid, 4methylphenoxyacetic acid, n-butoxyacetic acid, thiophenoxyacetic acid, 3-methoxythiophenoxyacetic acid, 2chlorothiophenoxyacetic acid, 2-methylthiophenoxyacetic acid, 4-nitrothiophenoxyacetic acid, n-butylthioacetic acid, phenylacetic acid, 2-nitrophenylacetic acid, 4nitrophenylacetic acid, 2,4-dinitrophenylacetic acid, benzoylformic acid, 4-chlorobenzoylformic acid, thiobenzoylformic acid, pyruvic acid, N-phenylglycine, N-(3chlorophenyl)glycine, N-(2,4-dichlorophenyl)glycine, N-(4acetylphenyl)glycine, N-(2-nitrophenyl)glycine, N-(2,4dinitrophenyl)glycine, N-(4-cyanophenyl)glycine, N-(2bromophenyl)glycine, N-(2-methylphenyl)glycine, N-(2methoxyphenyl)glycine, N-(2,4-dimethoxyphenyl)glycine, N-(nbutyl)glycine, N-methyl-N-(2-methylphenyl)glycine, N-methyl-N(4-chlorophenyl)glycine, N-methyl-N-(2-nitrophenyl)glycine, N-methyl-N-(2-methoxyphenyl)glycine, N-(4carbamoylphenyl)glycine and N-(4-sulfamoylphenyl)glycine.

The above-mentioned carboxyl group-containing group is bonded with the main chain of the polymer directly or through a connecting group Z. The connecting groups include an ether bond, amide bond, ester bond, urethane bond, ureide bond or a connecting group having such a bond. A part of the carboxylic acid-containing group may be contained in the main chain of the polymer.

Preferably, the polymer has the following general formula (II):

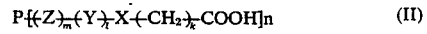  (II)

wherein X, Y, l and m are defined as in formula (I) and Z represents a group connecting the main chain of the polymer, P, with the group of said general formula (I) and is selected from the group consisting of an ether, amide, ester, urethane or ureide or a group containing such a bond, m represents 0 or 1, n represents a numeral so that the acid content of the polymer is 0.01 meq/g to 6.0 meq/g, and when k=l=0, X is >C=W.

The connecting groups having the ether bond, amide bond, ester bond, urethane bond or ureide bond include those of the following general formulae (III), (IV), (V) and (VI):

  (III)

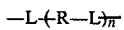 (IV)

 (V)

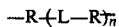 (VI)

wherein R's may be the same or different from one another and each represents an alkylene group, arylene group, aralkylene group or divalent heterocyclic ring, L's may be the same or different from one another and each represents an ether bond, amide bond, ester bond, urethane bond or ureide bond, and n represents 0, 1 or 2.

The polymers having the carboxyl group-containing group include, for example, acrylic resins, vinyl polymer resins including vinyl alcohol resins, polyurethane resins, polyurea resins, polyvinyl acetal resins, polyamide resins and epoxy resins. However, the polymers are not limited to them.

For example, the acrylic resins include homopolymers of monomers of the following general formula (VII) and copolymers thereof with another monomer copolymerizable therewith (such as an acrylic ester or methacrylic ester):

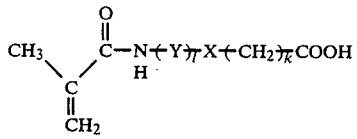 (VII)

The polyurethane resins can be produced by, for example, reacting a diol of the following general formula (VIII) with a diisocyanate:

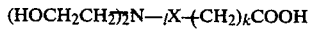 (VII)

The polyester resins can be produced by, for example, reacting a diol of the above general formula (VIII) with a compound having an acid chloride group at both ends.

The polymer of the present invention has an acid value of preferably 6.0 meq/g to 0.01 meq/g, particularly 2.0 meq/g to 0.1 meq/g. When it is lower than 0.01 meq/g, the developability with an alkali developer is reduced and, on the contrary, when it exceeds 6.0 meq/g, the coating strength and adhesion to the support are reduced. The resin may contain an additional carboxylic acid which does not participate in the decarboxylation induced by light. Two or more carboxylic acid-containing groups, which are decarboxylated by light, may be introduced into the polymer.

The weight average molecular weight of the present polymer is 2,000 to 1,000,000, preferably 8,000 to 200,000, as determined by a gel permeation chromatography. When the weight average molecular weight is less than 8,000, the intensity of the image is reduced and, on the contrary, when it exceeds 200,000, the developability is reduced.

Two or more of the polymers can be used together, or a mixture of the polymer with another polymer containing a carboxylic acid which is not decarboxylated by light can be used.

In the latter case, the mixing amount of the other polymer is 95 wt.% or less based on the total photosensitive composition. When it exceeds 95 wt.%, the characteristic feature of the present invention obtained by using the special polymer of the present invention is impaired. The polymers which can be introduced into the composition together with the present polymer include, for example, polyamide, epoxy, polyurethane, acrylic, polyester and polyvinyl acetal resins.

The sensitivity of the composition can be increased by adding a photosensitizer. The photosensitizers usable in the present invention include, for example, aromatic ketone compounds such as xanthone, fluorenone, benzophenone, thioxanthone, 2-methylthioxanthone, 2-chlorothioxanthone, 2-isopropylthioxanthone, 2,4-diethylthioxanthone, acetophenone, naphthylacetone, 4,4'-bisdimethylaminobenzophenone, trinitrofluorenone, dibenzosuberone, 2,5-bis(4'-diethylaminobenzal)cyclopentanone, α,α-dichloro-4-phenoxyacetophenone and 1-hydroxycyclohexyl phenyl ketone; aromatic thioketone compounds such as 4,4'-bisdimethylaminothiobenzophenone; quinone compounds such as benzoquinone, dichlorobenzoquinone, tetrachlorobenzoquinone, dichloronaphthoquinone, anthraquinone, phenanthrenequinone, dichloroanthraquinone, dinitroanthraquinone, alizarin and benzanthraquinone; aromatic nitro compounds such as nitrobenzene, 1-nitronaphthalene, 4-nitrobiphenyl, 4-nitrotoluene, 1,3-dinitrobenzene and 2,4,6-trinitroaniline; aromatic hydrocarbons such as naphthalene, anthracene, phenanthrene, benzanthracene and benzpyrene; triarylpyrazoline compounds such as triphenylpyrazoline; monoimidazole compounds such as tetraphenylimidazole and triphenylimidazole; xanthene compounds such as fluoresceine, Eosine Y, Rose Bengal, Erythrosine B and Phloxine; acridine compounds such as acriflavine, riboflavin, acridine, 9-phenylacridine, N-phenylacridine, phenazine, 2,3-diphenylquinoxaline and acenaphtho[1,2-b]quinoxaline; coumarin compounds described in U.S. Pat. No. 4,289,844 such as 7-N,N-diethylaminoketocoumarin, 3-benzoyl-7-diethylaminocoumarin, 3-benzoyl-7-methoxycoumarin and 3,3'-carbonylbis(7-diethylaminocoumarin); triphenylmethane compounds such as Thymol Blue, Bromothymol Blue and Bromocresol Green; and quinazolinone compounds such as 2-methyl-3-benzenesulfonyloxy-4(3H)-quinazolinone and 2-(β-styryl)-3-benzenesulfonyloxy-4(3H)-quinazolinone. A combination of two or more of these sensitizers can also be used.

The photosensitizer is preferably used in an amount of 0.01 to 50 wt.%, particularly 0.1 to 30 wt.%, based on the total composition. When the amount is less than 0.1 wt.%, the effect of the photosensitizer cannot be obtained sufficiently and, on the contrary, when it exceeds 30 wt.%, the coating strength and the sensitivity are reduced.

If necessary, additives such as a dye, pigment, stabilizer, filler, surfactant, plasticizer, anti-staining agent and ink-receptivity providing agent can be incorporated into the photosensitive composition of the present invention to improve the properties thereof. Preferred dyes include oil-soluble dyes such as C.I. 26105 (Oil Red RR), C.I. 21260 (Oil Scarlet #308), C.I. 74350 (Oil Blue), C.I. 52015 (Methylene Blue), C.I. 42555 (Crystal Violet) and C.I. 42595 (Victoria Pure Blue).

The photosensitive composition of the present invention is usually dissolved in a solvent. The solution is applied to a suitable support and dried. The application amount of the composition is about 0.01 to 500 g/m², preferably 0.1 to 200 g/m² (on dry basis).

The solvents include, for example, methanol, ethanol, isopropanol, n-butanol, t-butanol, 2-methoxyethanol, 2-ethoxyethanol, 2-methoxyethyl acetate, ethylene glycol, tetrahydrofuran, dioxane, dimethyl sulfoxide, N,N-dimethylformamide, acetone, methyl ethyl ketone, 1-methoxy-2-propanol, 2-methoxy-1-propanol, 1-methoxy-2-acetoxypropane, 2-methoxy-1-acetoxypropane, ethyl acetate, methyl acetate, toluene, xylene and mixtures of them.

The supports to which the photosensitive composition of the present invention can be applied include, for example, papers; papers laminated with a plastic (such as polyethylene, polypropylene or polystyrene); plates of metals such as aluminum (including aluminum alloys), zinc and copper; films of plastics such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal; and papers and plastic films laminated with the above-mentioned metals or vapor-deposited with the metals. Among them, an aluminum plate is particularly preferred when it is used as a printing plate, since it has a quite high dimensional stability and is inexpensive. Further, composite sheets comprising a combination of a polyethylene terephthalate film and an aluminum sheet, as described in Japanese Patent Publication for Opposition Purpose (hereinafter referred to as "J.P. KOKOKU") No. 48-18327, are also preferred.

Supports having a metal surface, particularly aluminum surface, are preferably subjected to a surface treatment such as an electrolytic graining treatment, composite graining treatment, sand graining treatment, immersion treatment in an aqueous solution of sodium silicate, potassium fluorozirconate or a phosphate, or anodic oxidation treatment. Preferred anodic oxidation treatment methods include a method wherein the anodic oxidation is conducted in sulfuric acid with a high current density as described in British Patent No. 1,412,768, a method wherein the anodic oxidation is conducted by using phosphoric acid as the electrolytic bath as described in U.S. Pat. No. 3,511,661, and a method wherein the anodic oxidation is conducted in a mixture of phosphoric acid and sulfuric acid as described in Japanese Patent Publication for Opposition Purpose (hereinafter referred to as "J.P. KOKOKU") No. 46-43124 and Japanese Patent Unexamined Published Application (hereinafter referred to as "J.P. KOKAI") Nos. 52-103208 and 55-28400. Aluminum plates which were grained with sand and then immersed in an aqueous sodium silicate solution, and aluminum plates which were subjected to the anodic oxidation and then immersed in an aqueous alkali metal silicate solution as described in J.P. KOKOKU No. 47-5125 are also preferred. The anodic oxidation is conducted by application of electric current in an electrolytic solution comprising an aqueous or non-aqueous solution of an inorganic acid such as phosphoric, chromic, sulfuric or boric acid or an organic acid such as oxalic or sulfamic acid or a salt of such an acid or two or more of the solutions, using an aluminum plate as an anode.

It is also preferred to conduct a sealing treatment after the graining and anodic oxidation. The sealing treatment is conducted by immersion in an aqueous sodium silicate solution, aqueous polyvinylphosphonic acid solution, hot water or hot aqueous solution of an inorganic salt or organic salt or by the treatment in a steam bath.

Further, a silicate electrodeposition method as described in U.S. Pat. No. 3,658,662 is also effective.

The photosensitive composition of the present invention applied to the support is exposed through a transparent original image having a line or halftone dot image and then developed with an aqueous developer to obtain a negative relief image for the original.

The light sources usable for the exposure include, for example, carbon arc lamp, mercury lamp, xenon lamp, tungsten lamp, metal halide lamp, argon laser and excimer laser.

The polymer of the present invention is mainly used as a material for printing plates and resists.

The following Examples will further illustrate the present invention, which by no means limit the invention. In the Examples, percentages and parts are given by weight unless otherwise stated.

[EXAMPLES]

(Preparation Example 1)

Preparation of:

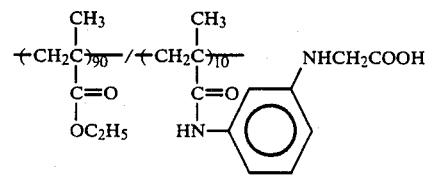

16.7 parts of ethyl bromoacetate was added dropwise to a mixture of 17.6 parts of m-aminomethacrylic anilide, 6.9 parts of potassium carbonate and 25 parts of N,N-dimethylformamide under stirring and cooling at 0° C. or below. After completion of the addition, the mixture was stirred at room temperature for 3 hours, 80 parts by weight of water was added to the mixture. After extraction with ethyl acetate, the ethyl acetate layer was washed with dilute hydrochloric acid and then with saturated aqueous common salt solution and dried over magnesium sulfate. The product was concentrated by means of an evaporator and a solid thus obtained was recrystallized from methanol to obtain 15.0 parts of Compound (B) having the following structural formula (B):

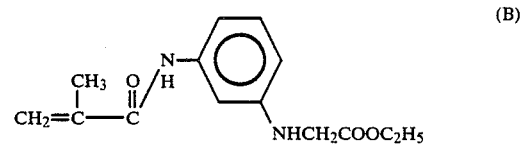

15.0 parts of Compound (B) was dissolved in 20 parts of ethanol. The solution was cooled with ice. A solution of 2.3 parts of sodium hydroxide in 60 parts of water was added dropwise to the cooled solution. The mixture was stirred at 20° C. for 30 minutes and then washed with ethyl acetate. pH of the mixture was adjusted at 2 with a 1 N-aqueous hydrochloric acid solution. After washing with ethyl acetate, a 1 N-aqueous sodium hydroxide solution was added thereto to adjust pH of the aqueous layer at 3. After extraction with ethyl acetate followed by drying over magnesium sulfate, the product was concentrated by means of an evaporator to obtain 9.0 parts of Compound (C) having the following structural formula (C):

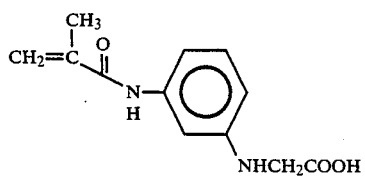

2.34 parts of Compound (C) and 10.28 parts of ethyl methacrylate were dissolved in 38.0 parts of methyl cellosolve under a nitrogen atmosphere. The solution was stirred and heated at 70° C. 0.164 part of azobisisobutyronitrile (AIBN) was added to the solution and the mixture was stirred for 5 hours and then at 85° C. for 3 hours to obtain Polymer (A) having a weight average molecular weight of 58,000.

(Preparation Example 2)

Preparation of:

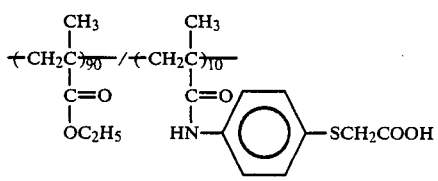

1.6 parts of sodium hydroxide was dissolved in ethanol. A solution of 5 parts of p-aminothiophenol in 20 parts of ethanol was added to the solution. The mixture thus obtained was cooled at 0° C. or below. A solution of 3.8 parts of chloroacetic acid and 3.4 parts of sodium hydrogencarbonate in 10 parts of water was added dropwise to the mixture, while the mixture was kept at 0° C. or below. After completion of the addition, the mixture was stirred at 0° C. for 3 hours and then adjusted at pH 3. A solid thus formed was filtered to obtain 5.4 parts of p-aminothiophenoxyacetic acid.

5 parts of p-aminothiophenoxyacetic acid and 2.7 parts of pyridine were dissolved in 40 parts of DMF. 3.2 parts of methacryloyl chloride was added dropwise to the solution at 0° C. or below. After completion of the addition, the mixture was stirred at 0° C. for 1 hour and then at 25° C. for 2 hours. Then, the reaction mixture thus obtained was added to 500 parts of an aqueous hydrochloric acid solution having a pH of 1. After extraction with ethyl acetate, the ethyl acetate layer was dried over magnesium sulfate and the concentration was conducted. The crystals thus formed were recrystallized from ethyl acetate to obtain 1.26 parts of Compound (E) having the following formula (E):

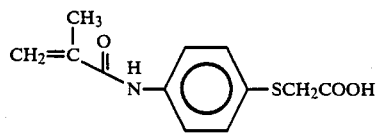

1.26 parts of Compound (E) and 5.14 parts of methacrylate were dissolved in 25 parts of methyl cellosolve under a nitrogen atmosphere. The solution was stirred under heating at 70° C. for 5 hours and then at 80° C. for 3 hours to obtain Polymer (D) having a weight average molecular weight of 40,000.

(Preparation Example 3)

Preparation of:

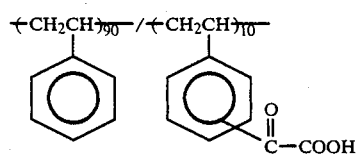

20.8 parts of a polystyrene having a weight average molecular weight of 10,000 and 13.5 parts of ethyloxalyl chloride were dissolved in 500 parts of carbon disulfide. 18.22 parts of aluminum chloride was slowly added to the solution under stirring. The mixture was stirred under reflux for 1.5 hour and then 70% of carbon disulfide was distilled off. The residue was added to a mixture of 40 parts of concentrated hydrochloric acid and 100 parts of ice. After decantation, water was added to the residue and this mixture was decanted. A solid residue thus obtained was dissolved in acetone. After reprecipitation from methanol followed by filtration, 11.5 g of Polymer (G) was obtained.

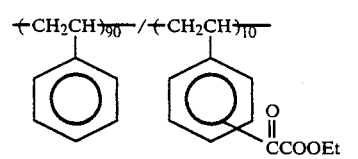

Then, 10 parts of Polymer (G) was dissolved in 600 parts of THF. 50 parts of a 1 N aqueous sodium hydroxide solution and 150 parts of water were added to the solution and the mixture was refluxed for 2 hours. After completion of the reaction, 28.8 parts of acetic acid was added to the reaction mixture. The product was reprecipitated from methanol and dried to obtain 4.0 parts of Polymer (F).

Examples 1 to 10

The surface of an aluminum plate having a thickness of 0.24 mm was grained with a nylon brush and an aqueous suspension of 400 mesh pumice powder and then thoroughly washed with water. It was immersed in 10% aqueous sodium hydroxide solution at 70° C. for 60 second to conduct etching. It was washed with running water and then with a 20% nitric acid solution to neutralize it. The plate surface was electrolytically roughened by an electrochemical surface-roughening method described in J.P. KOKAI No. 53-67507, viz., the plate was grained in a 1% aqueous sulfuric acid solution using alternating sinusoidal current under conditions of $V_A=12.7$ V and $V_c=9.1$ V so that the quantity of electricity was 160 C/dm$^3$. The product was then immersed in a 30% aqueous sulfuric acid solution to remove smuts at 55° C. for 2 minutes and then subjected to the anodic oxidation in 7% aqueous sulfuric acid solution in order to have a thickness of 2.0 g/m$^2$. The plate was immersed in a 3% aqueous sodium silicate solution at 70° C. for 1 minute, washed with water and dried.

A sensitizing solution having the following composition was applied to the thus obtained aluminum plate by means of whirler and dried at 80° C. for 2 minutes. The dry weight was 2.0 g/m$^2$.

| Composition of the sensitizing solution | Amount |
|---|---|
| 25% solution of Polymer (A) in methyl cellosolve | 2 g |
| sensitizer (Table 1) | Table 1 |
| Victoria Pure Blue BOH | 0.018 g |
| 2-methoxyethanol | 8.5 g |

TABLE 1

| Example | Sensitizer | Amount (mg) |
|---|---|---|
| 1 | 1-nitronaphthalene | 17.3 |
| 2 | 2,4-diethylthioxanthone | 26.8 |
| 3 | phenanthrenonequinone | 20.8 |
| 4 | acridine | 17.9 |
| 5 | phenazine | 18.0 |
| 6 | anthracene | 17.8 |
| 7 | 3,3'-carbonylbis(7-diethylaminocoumarin) | 46.0 |
| 8 | 2-methyl-3-benzenesulfonyloxy-4(3H)-quinazolinone | 40.4 |
| 9 | Michler's ketone | 26.8 |
| 10 | none | — |

The photosensitive lithographic plate thus prepared was subjected to an image-forming exposure through a step wedge with PS Light (a product of Fuji Photo Film Co., Ltd.) at a distance of 1 m for 5 minutes. The plate was immersed in a developer having the following composition at room temperature for 1 minute and washed with water to remove an unexposed region and to obtain lithographic plates (1) to (10) (Examples 1 to 10), each having a light blue image.

| Composition of the developer | Amount |
|---|---|
| sodium sulfite | 5 g |
| benzyl alcohol | 30 g |
| sodium carbonate | 5 g |
| sodium isopropylnaphthalenesulfonate | 12 g |
| water | 1000 g |

The results were shown in the following Table 2.

TABLE 2

| Example | Clear step number |
|---|---|
| 1 | 7 |
| 2 | 4 |
| 3 | 12 |
| 4 | 11 |
| 5 | 5 |
| 6 | 2 |
| 7 | 3 |
| 8 | 2 |
| 9 | 10 |
| 10 | 1 |

Examples 11 to 20

The surface of an aluminum plate having a thickness of 0.24 mm was grained with a nylon brush and an aqueous suspension of 400 mesh pumice powder and then thoroughly washed with water. It was immersed in a 10% aqueous sodium hydroxide solution at 70° C. for 60 seconds to conduct etching. It was washed with running water and then with a 20% nitric acid solution to neutralize it. The plate surface was electrolytically roughened by an electrochemical surface-roughening method described in J.P. KOKAI No. 53-67507, wherein the plate was grained in a 1% aqueous sulfuric acid solution using alternating sinusoidal current under conditions of $V_A = 12.7$ V and $V_c = 9.1$ V so that the quantity of electricity was 160 C/dm$^3$. The product was then immersed in a 30% aqueous sulfuric acid solution to remove smuts at 55° C. for 2 minutes and then subjected to the anodic oxidation in a 7% aqueous sulfuric acid solution in order to provide a thickness of 2.0 g/m$^2$. The plate was immersed in a 3% aqueous sodium silicate solution at 70° C. for 1 minute, washed with water and dried. A sensitizing solution having the following composition was applied to the thus obtained aluminum plate by means of a whirler and dried at 80° C. for 2 minutes. The dry weight was 2.0 g/m$^2$.

| Composition of the sensitizing solution | Amount |
|---|---|
| 25% solution of Polymer (D) in methyl cellosolve | 2 g |
| sensitizer (Table 3) | Table 3 |
| Oil Blue | 0.018 g |
| 2-methoxyethanol | 8.5 g |

TABLE 3

| Example | Sensitizer | Amount (mg) |
|---|---|---|
| 11 | 1-nitronaphthalene | 17.3 |
| 12 | 2,4-diethylthioxanthone | 26.8 |
| 13 | phenanthrenequinone | 20.8 |
| 14 | acridine | 17.9 |
| 15 | phenazine | 18.0 |
| 16 | anthracene | 17.8 |
| 17 | 3,3'-carbonylbis(7-diethylaminocoumarin) | 46.0 |
| 18 | 2-methyl-3-benzenesulfonyloxy-4(3H)-quinazolinone | 40.4 |
| 19 | Michler's ketone | 26.8 |
| 20 | none | — |

The photosensitive lithographic plate thus prepared was subjected to an image-forming exposure through a step wedge with PS Light (a product of Fuji Photo Film Co., Ltd.) at a distance of 1 m for 10 minutes. The plate was immersed in a developer having the following composition at room temperature for 1 minute and then washed with water to remove an unexposed region and to obtain lithographic plates (11) to (20) (Examples 11 to 20), each having a light blue image.

| Composition of the developer | Amount |
|---|---|
| sodium sulfite | 5 g |
| benzyl alcohol | 30 g |
| sodium carbonate | 5 g |
| sodium isopropylnaphthalenesulfonate | 12 g |
| water | 1000 g |

The results were shown in the following Table 4.

TABLE 4

| Example | Clear step number |
|---|---|
| 11 | 7 |
| 12 | 4 |
| 13 | 9 |
| 14 | 10 |
| 15 | 5 |
| 16 | 2 |
| 17 | 2 |
| 18 | 2 |
| 19 | 6 |
| 20 | 1 |

Examples 21 to 30

The surface of an aluminum plate having a thickness of 0.24 mm was grained with a nylon brush and an aqueous suspension of 400 mesh pumice powder and then thoroughly washed with water. It was immersed in a 10% aqueous sodium hydroxide solution at 70° C. for 60 seconds to conduct etching. It was washed with running water and then with a 20% nitric acid solution to neutralize it. The plate surface was electrolytically roughened by an electrochemical surface-roughening method described in J.P. KOKAI No. 53-67507, wherein the plate was grained in 1% aqueous sulfuric acid solution using alternating sinusoidal current under conditions of $V_A=12.7$ V and $V_c=9.1$ V so that the quantity of electricity was 160 C/dm$^3$. The product was then immersed in a 30% aqueous sulfuric acid solution to remove smuts at 55° C. for 2 minutes and then subjected to the anodic oxidation in a 7% aqueous sulfuric acid solution in order to have a thickness of 2.0 g/m$^2$. The plate was immersed in a 3% aqueous sodium silicate solution at 70° C. for 1 minute, washed with water and dried. A sensitizing solution having the following composition was applied to the thus obtained aluminum plate by means of a whirler and dried at 80° C. for 2 minutes. The dry weight was 2.0g/m$^2$.

| Composition of the sensitizing solution | Amount |
| --- | --- |
| Polymer (F) | 0.5 g |
| sensitizer (Table 5) | Table 5 |
| Victoria Pure Blue B-OH | 0.018 g |
| tetrahydrofuran | 10 g |

TABLE 5

| Example | Sensitizer | Amount (mg) |
| --- | --- | --- |
| 21 | 1-nitronaphthalene | 17.3 |
| 22 | 2,4-diethylthioxanthone | 26.8 |
| 23 | phenanthrenequinone | 20.8 |
| 24 | acridine | 17.9 |
| 25 | phenazine | 18.0 |
| 26 | anthracene | 17.8 |
| 27 | 3,3'-carbobis(7-diethylaminocoumarin) | 46.0 |
| 28 | 2-methyl-3-benzenesulfonyloxy-4(3H)-quinazolinone | 40.4 |
| 29 | Michler's ketone | 26.8 |
| 30 | none | — |

The photosensitive lithographic plate thus prepared was subjected to an image-forming exposure through a step wedge with PS Light (a product of Fuji Photo Film Co., Ltd.) at a distance of 1 m for 5 minutes. The plate was immersed in a developer having the following composition at room temperature for 1 minute and the surface thereof was lightly scrubbed with an absorbent wadding to remove an unexposed region and to obtain lithographic plates (21) to (30) (Examples 21 to 30), each having a light blue image.

| Composition of the developer | Amount |
| --- | --- |
| sodium sulfite | 5 g |
| tetrahydrofuran | 30 g |
| sodium carbonate | 5 g |
| sodium isopropylnaphthalenesulfonate | 12 g |
| water | 1000 g |

The results were shown in the following Table 6.

TABLE 6

| Example | Clear step number |
| --- | --- |
| 21 | 9 |
| 22 | 5 |
| 23 | 9 |
| 24 | 11 |
| 25 | 4 |
| 26 | 4 |
| 27 | 3 |
| 28 | 5 |
| 29 | 9 |
| 30 | 5 |

Comparative Examples 31 to 40

The surface of an aluminum plate having a thickness of 0.24 mm was grained with a nylon brush and an aqueous suspension of 400 mesh pumice powder and then thoroughly washed with water. It was immersed in a 10% aqueous sodium hydroxide solution at 70° C. for 60 seconds to conduct etching. It was washed with running water and then with 20% nitric acid solution to neutralize it. The plate surface was electrolytically roughened by an electrochemical surface-roughening method described in J.P. KOKAI No. 53-67507, wherein the plate was grained in 1% aqueous sulfuric acid solution using alternating sinusoidal current under conditions of $V_A=12.7$ V and $V_c 9.1$ V so that the quantity of electricity was 160 C/dm$^3$. The product was then immersed in 30% aqueous sulfuric acid solution to remove smuts at 55° C. for 2 minutes and then subjected to the anodic oxidation in a 7% aqueous sulfuric acid solution in order to have a thickness of 2.0 g/m$^2$. The plate was immersed in a 3% aqueous sodium silicate solution at 70° C. for 1 minute, washed with water and dried. A sensitizing solution having the following composition was applied to the thus obtained aluminum plate by means of a whirler and dried at 80° C. for 2 minutes. The dry weight was 2.0 g/m$^2$.

| Composition of the sensitizing solution | Amount |
| --- | --- |
| 25% solution of Polymer (H) in methyl cellosolve | 2 g |
| sensitizer (Table 7) | Table 7 |
| Oil Blue | 0.018 g |
| 2-methoxyethanol | 8.5 g |

Polymer (H):

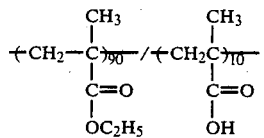

(weight average molecular weight: 55,000)

TABLE 7

| Example | Sensitizer | Amount (mg) |
| --- | --- | --- |
| 31 | 1-nitronaphthalene | 17.3 |
| 32 | 2,4-diethylthioxanthone | 26.8 |
| 33 | phenanthrenequinone | 20.8 |
| 34 | acridine | 17.9 |
| 35 | phenazine | 18.0 |
| 36 | anthracene | 17.8 |
| 37 | 3,3'-carbonylbis(7-diethylaminocoumarin) | 46.0 |
| 38 | 2-methyl-3-benzenesulfonyloxy-4(3H)-quinazolinone | 40.4 |
| 39 | Michler's ketone | 26.8 |

TABLE 7-continued

| Example | Sensitizer | Amount (mg) |
|---------|-----------|-------------|
| 40 | none | — |

The photosensitive lithographic plate thus prepared was subjected to an image-forming exposure through Fuji PS Step Guide (a product of Fuji Photo Film Co., Ltd.) at a distance of 1 m with PS Light (a product of Fuji Photo Film Co., Ltd.) for 10 minutes. The plate was immersed in a developer having the following composition at room temperature for 1 minute. No image could be formed.

| Composition of the developer | Amount |
|---|---|
| sodium sulfite | 5 g |
| benzyl alcohol | 30 g |
| sodium carbonate | 5 g |
| sodium isopropylnaphthalenesulfonate | 12 g |
| water | 1000 g |

What is claimed is:

1. An image-forming layer comprising a polymer having a carboxyl group-containing group which can be decarboxylated by exposure to light in the presence or absence of a photosensitizer, said polymer having the following formula:

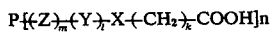

$$P[(Z)_m(Y)_l X (CH_2)_k COOH]_n$$

wherein X represents a sulfur atom, an oxygen atom, a single bond, $>C=W$ or $>N-U$, W being an oxygen or a sulfur atom and U being a substituted or unsubstituted aryl or alkyl group or a hydrogen atom, Y represents a substituted or unsubstituted alkylene, arylene or a divalent heterocyclic ring, P represents the main chain of the polymer, Z is selected from the group consisting of an ether, amide, ester, urethane or ureide or a group containing such a bond, k represents 0 or 1, l represents 0 or 1, m represents 0 or 1, n represents a numeral so that the acid content of the polymer is 0.01 meq/g to 6.0 meq/g, and, when $k=1=0$, x is $>C=W$.

2. The photosensitive image-forming layer of claim 1 wherein said carboxyl group-containing group includes a residue having a skeleton of the compound selected from the group consisting of indole-3-acetic acid, phenoxyacetic acid, 2-methylphenoxyacetic acid, 3-methoxyphenoxyacetic acid, 2-nitrophenoxyacetic acid, 3-chlorophenoxyacetic acid, 4-methylphenoxyacetic acid, n-butoxyacetic acid, thiophenoxyacetic acid, 3-methoxythiophenoxyacetic acid, 2-chlorothiophenoxyacetic acid, 2-methylthiophenoxyacetic acid, 4-nitrothiophenoxyacetic acid, n-butylthioacetic acid, phenylacetic acid, 2-nitrophenylacetic acid, 4-nitrophenylacetic acid, 2,4-dinitrophenylacetic acid, benzoylformic acid, 4-chlorobenzoylformic acid, thiobenzoylformic acid, pyruvic acid, N-phenylglycine, N-(3chlorophenyl)glycine, N-(2,4-dichlorophenyl)glycine, N-(4acetylphenyl)glycine, N-(2-nitrophenyl)glycine, N-(2,4dinitrophenyl)glycine, N-(4-cyanophenyl)glycine, N-(2-bromophenyl)glycine, N-(2-methylphenyl)glycine, N-(2methoxyphenyl)glycine, N-(2,4-dimethoxyphenyl)glycine, N-(nbutyl)glycine, N-methyl-N-(2-methylphenyl)glycine, N-methyl-N(4-chlorophenyl)glycine, N-methyl-N-(2-nitrophenyl)glycine, N-methyl-N-(2-methoxyphenyl)glycine, N-(4-carbamoylphenyl)glycine and N-(4-sulfamoylphenyl)glycine.

3. The photosensitive image-forming layer of any one of claims 1 or 2 wherein said layer contains a photosensitizer.

4. The photosensitive image-forming layer of claim 1 wherein said polymer has a weight average molecular weight of 2000 to 1,000,000 as determined by a gel permeation chromatography.

5. The photosensitive image-forming layer of claim 4 wherein said polymer has a weight average molecular weight of 8000 to 200,000 as determined by a gel permeation chromatography.

6. The photosensitive image forming layer of claim 1 wherein the acid content of the polymer is about 0.1 meq/g to 2 meq/g.

* * * * *